(12) United States Patent
Kitagaki

(10) Patent No.: US 6,289,478 B1
(45) Date of Patent: Sep. 11, 2001

(54) DATA PROCESSING APPARATUS FOR IC TESTER

(75) Inventor: Takashi Kitagaki, Tokyo (JP)

(73) Assignee: Agilent Technologies, Inc., Loveland, CO (US)

( * ) Notice: Subject to any disclaimer, the term of this patent is extended or adjusted under 35 U.S.C. 154(b) by 0 days.

(21) Appl. No.: 09/253,654

(22) Filed: Feb. 20, 1999

(30) Foreign Application Priority Data

Feb. 27, 1998 (JP) .................................................. 10-048295

(51) Int. Cl.[7] .................................................. G01R 31/28
(52) U.S. Cl. .................................................. 714/724
(58) Field of Search .................................. 714/724, 738, 714/739, 32, 33; 703/13, 14, 15, 21, 23, 24, 25, 28

(56) References Cited

U.S. PATENT DOCUMENTS

| 5,109,353 | 4/1992 | Sample et al. ......................... 364/578 |
| 5,802,290 | * 9/1998 | Casselman ............................. 709/201 |
| 6,006,022 | * 12/1999 | Rhim et al. ...................... 395/500.02 |
| 6,141,636 | * 10/2000 | Sarno et al. ............................. 703/23 |

FOREIGN PATENT DOCUMENTS

| 06180342A | 6/1994 | (JP) . |
| 09006641A | 1/1997 | (JP) . |

* cited by examiner

Primary Examiner—Christine T. Tu

(57) ABSTRACT

A data processing apparatus for an IC tester that generates data or evaluates data, includes a first memory; a first reconfigurable logic device operative during input and output of data, for converting signals for internal use in the data processing apparatus, an internal configuration of the first reconfigurable logic device being alterable to accomplish such converting; a second reconfigurable logic device for receiving data from the first memory or the first reconfigurable logic device and for processing the data in accordance with an internally configured combination of elements, an internal configuration of the second reconfigurable logic device being alterable to accomplish details of the processing; a third reconfigurable logic device for establishing a specific interface when data is transmitted and received between the second reconfigurable logic device and the first memory, an internal configuration of the third reconfigurable logic device being alterable in accordance with a selected type of interface; and a device coupled to each of the first, second and third reconfigurable logic devices for inputting an internal configuration to each thereof.

6 Claims, 4 Drawing Sheets

DATA PROCESSING APPARATUS FOR IC TESTER

FIELD OF THE INVENTION

The present invention pertains to the field of semiconductor testing, and more particularly, to a digital data processing apparatus that is used when semiconductors are tested with an IC tester.

BACKGROUND OF THE INVENTION

FIG. 1 is a block diagram showing how digital data are processed by a conventional IC tester 10. When data are generated, tester controller 20 writes the data in memory 18 and each TVG (test vector generator) 16 reads the corresponding daza from memory 18 and generates a test vector at a specific time. This vector is then fed as signals through pin electronics 14 for the corresponding pin to a specific terminal of a DUT (device under test) 12. Master sequencer 26 controls the test sequence, such as the starting and stopping of the data generation, etc., between tester controller 20, memory 18 and several TVGs 16. A general purpose computer, such as a UNIX Work Station, is used for tester controller 20. The bandwidth of the bus from tester controller 20 to memory 18 is usually not as wide as that of the bus between each TVG 16 and memory 18 that is internally configured in the IC tester.

On the other hand, when data are evaluated, signals output from the DUT terminal are formatted to a specific level inside the corresponding pin electronics 14 and are then produced by TVG 16 as data, at specific times, and are stored in memory 18. Data stored in memory 18 are eventually read by tester controller 20. Tester controller 20 perform operations, then evaluates the data. Master sequencer 26 controls the test sequence, such as starting and stopping of data acquisition, etc., between tester controller 20, memory 18 and the several TVGs 16.

Although in the case of newer ICs it may be necessary to produce random data sequences and data of a larger period may be needed for the test, by means of the structure in FIG. 1, only tester controller 20 is able to write data in memory 18 and therefore, there is a disadvantage in that preparation for producing the data takes a long time. Moreover, if the data period is long and has not been entered in memory 18, the speed of data transfer from tester controller 20 to memory 18 is slow and real time DUT tests cannot be performed.

A new module for data generation that has a larger memory may also be developed, but the new development is expensive and takes a year or longer to develop. Consequently, other problems are encountered with development of ICs that use these modules.

Moreover, although some of the newest ICs for high speed communication must be tested in a condition of which the data header is long or the data part is long, it is difficult to discard the header in real time while the data are being read and stored only the long body of data. Therefore, once all of the data have been stored in the memory, the memory details are read in succession by the tester controller and the results are obtained. As a result, it takes time to transfer data to tester controller 20.

FIG. 2 is a block diagram of IC tester 30 with a conventional DSP (digital signal processing) function. Furthermore, unless otherwise noted, the same symbols and numbers are used for the same structural elements in the several Figures.

By means of the structure in FIG. 2, DSP part 2 is connected to memory 18 via local bus 24 as an addition to FIG. 1. Master sequencer 28 controls the test sequence between tester controller 20, memory 18, the several TVGs 16, and DSP part 22. By means of this structure, DSP part 22 can directly read and perform operations for the data in memory 18 and write data to memory 18. Therefore, there is a reduction in the items processed by Lester controller 20 and high-speed testing is possibe. Nevertheless, high-speed multifunctional DSP devices are expensive. Moreover, such high speed testing cannot be realized when the DSP part is not used as originally intended, for instance, when it is used for a bit operation such as a shift operation, etc. Further, since the DSP is controlled by a microprogram system, its capability is limited. For the aforementioned reasons, achieving high speed with a DSP only is a problem in terms of cost/performance.

A high-speed shift operation can be easily obtained if the proper hardware is available, but the cost of making a new ASIC (application-specific integrated circuit) is high, and it takes a year or longer to develop an ASIC. Further, this type of ASIC is used for special purposes and few are produced. Therefore, developing an ASIC is unacceptable in terms of both the cost and the development period. Even if the funds are available to develop an advanced ASIC, will probably become necessary to focus on the development of the next ASIC without recovering the cost of the previous ASIC because of the rapid progress of ICs to be tested.

IC test applications are often made in line with the stage of development of the IC, but because specifications of the IC often change before development is completed, there is also a problem that it will be necessary to become familiar with the changes in such specifications while keeping the detrimental effects on performance to a minimum when developing an ASIC.

On the other hand, a processing apparatus for special processing of data content that uses an FPGA (field programmable gate array) is described in Japanese Patent laid-open No. Heisei 6(1994)180,342 "IC Evaluation Device" with a laid-open date of Jun. 28, 1994 and Japanese Patent laid-open No. Heisei 9(1997)-6641 "Information Processing Apparatus" with a laid-open date of Jan. 10, 1997. The capability of these devices is limited in terms of high-speed generation or evaluation of data with a complex pattern and they cannot be used as a general-purpose digital data processing apparatus for IC testing.

Accordingly, it is an object of the present invention to solve the aforementioned problems by providing a general-purpose digital data processing apparatus for IC testers. IC test applications that are faster than those of conventional systems can be constructed for the general-purpose digital data processing apparatus for IC tests of the present invention by fewer man-hours, and these applications can be flexibly executed.

Another object of the present invention is to provide a general-purpose data processing apparatus equipped with a data-generation function or a data-evaluation function with a simple design so that one device can be flexibly reconfigured for several applications.

Another object of the present invention is to provide a general-purpose data processing apparatus for IC testing that uses a large memory and reconfigurable logic devices.

Yet another object of the present invention is to provide a data processing apparatus for IC testing that uses a high-speed memory, a DSP, and reconfigurable logic devices so that the DSP and reconfigurable logic devices are efficiently used, making high-speed execution of applications possible, and a reduction of the number of development processes possible.

SUMMARY OF THE INVENTION

The invention has a first reconfigurable logic device, which converts the input and output data signals to/from an internal configuration so that they can be easily used internally. The internal configuration of the first reconfigurable logic device can be altered in accordance with the details of such conversion. A second reconfigurable logic device is provided which receives data from a first memory of the first reconfigurable logic device and processes the data in accordance with an internally configured combination of elements. The internal configuration of the second reconfigurable logic device can be altered in accordance with the details of this conversion. A third reconfigurable logic device is provided which selects a specific interface when data are sent between the second reconfigurable logic device and first memory. The internal configuration of the third reconfigurable logic device can be altered in accordance with a type of interface with the first memory. The first through third reconfigurable logic devices are each equipped with a writing line for writing the internal configuration.

The invention further has a second memory that transmits data to and receives data from the second reconfigurable logic device. The path for transmission and reception of data is a high-speed bus that is different from the path for data between the second and third reconfigurable logic devices.

Furthermore, the invention utilizes a digital signal processor that transmits data to and receives data from the second memory, and the digital signal processor further sends data to and receives data from the second and third reconfigurable logic devices. The first through third reconfigurable logic devices are preferably configured with field programmable gate arrays (FPGA) and are operated by a controller that includes a sequencer and a sequence memory.

DETAILED DESCRIPTION OF THE INVENTION

Figure 1:
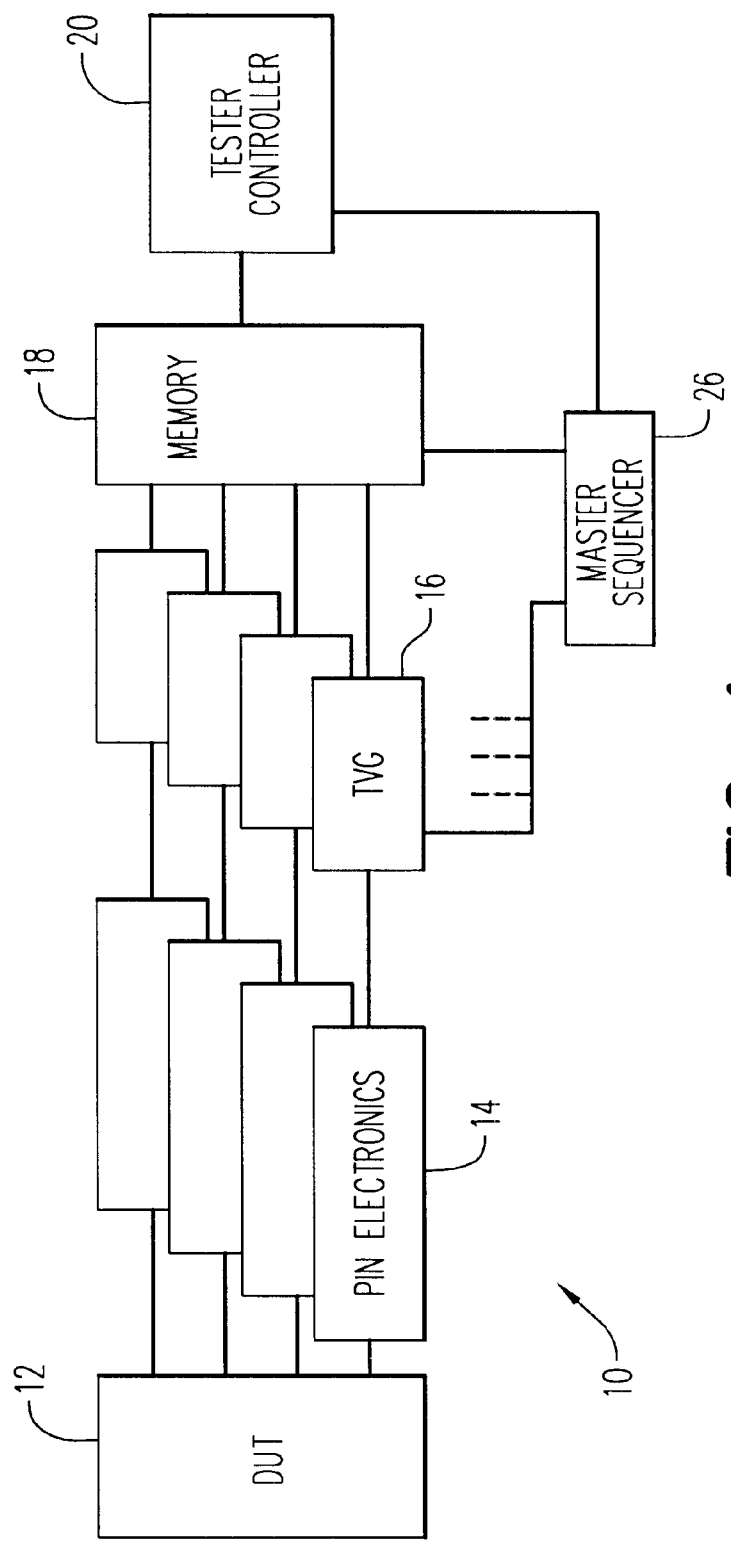
FIG. 1 is a block diagram explaining how digital data are processed with a conventional IC tester.
Figure 2:
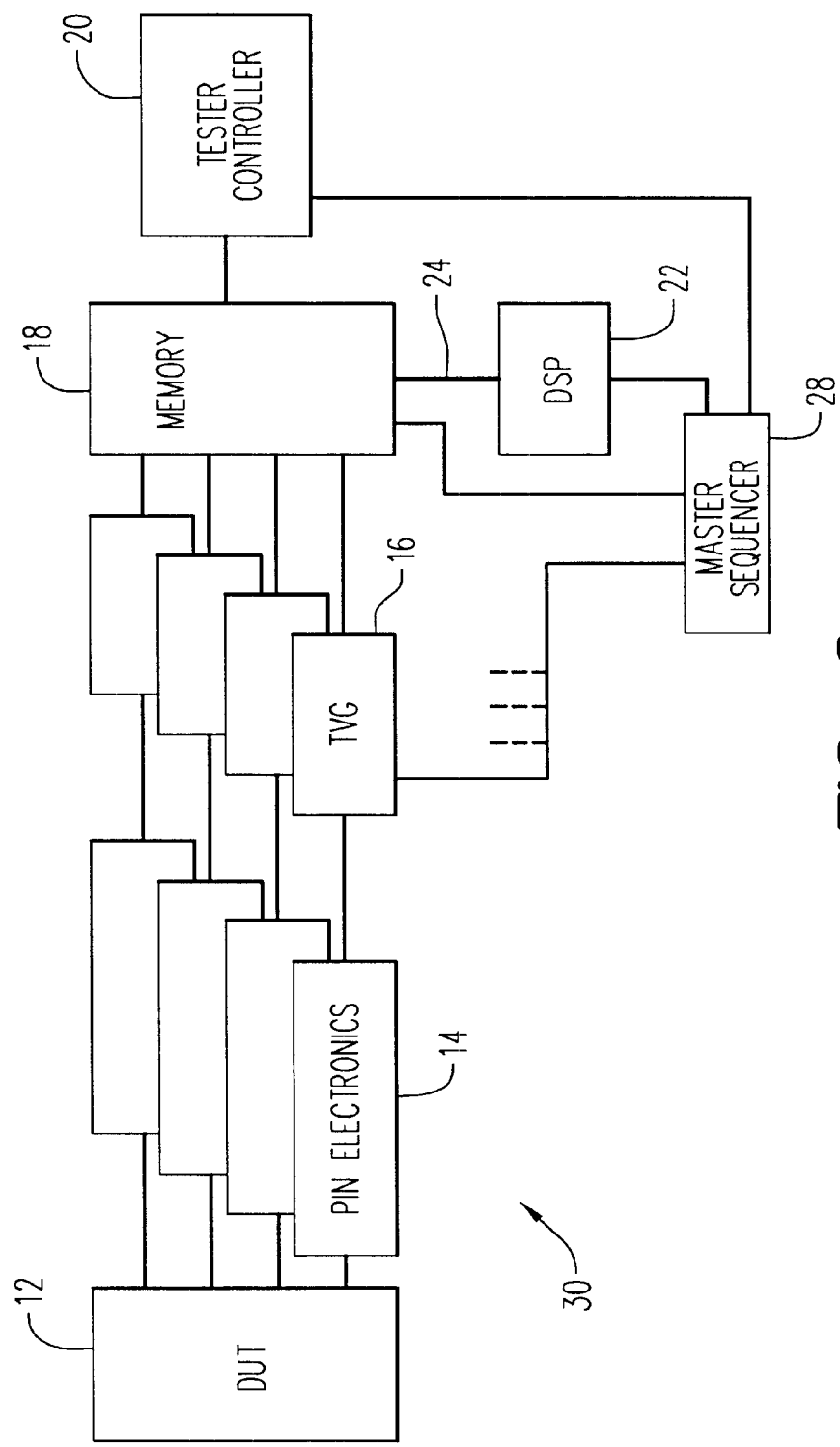
FIG. 2 is a block diagram explaining how digital data are processed with a conventional IC tester that has a DSP.
Figure 3:
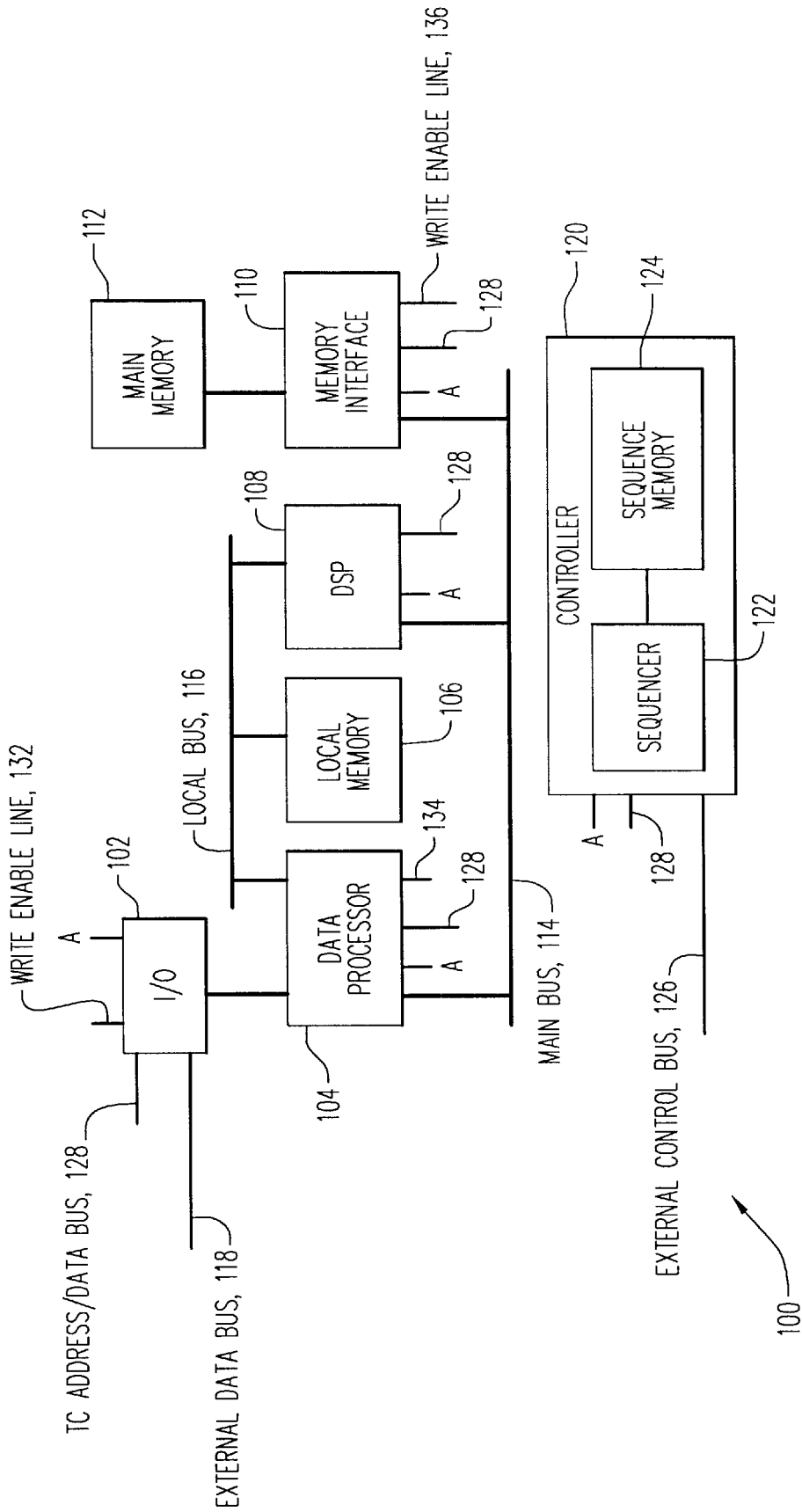
FIG. 3 is a block diagram of the data processing apparatus of the present invention.

FIG. 3 shows digital data processor (DDP) 10J which is the data processing apparatus for IC testing of the present invention. DDP 100 is equipped with I/O (input-output) part 102, data processing part 104, local memory 106, DSP 108, memory I/F (interface) part 110, main memory 112, controller part 120, main bus 114, and local bus 116. One or more reconfigurable logic devices are included in each of I/O part 102, data processing par. 104, and memory I/F part 110.

I/O part 102 is connected between external data bus 118 and data processing part 104 and operates by adjusting the necessary signals so that they can be easily processed in data processing part 104. For example, data lines from external data bus 118 are arranged in accordance with the specifications of data processing part 104 and are output to data processing part 104, or vice-versa. Moreover, I/O part 102 not only arranges data lines, but also performs operations such as logical processing of many signal lines to reconfigure the signal lines.

Data processing part 104 is connected to I/O part 102 and main bus 114 and local bus 116, respectively. Data processing par, 104 reads data from one of these modules, performs data processing according to its configured internal logics, and the results are output to one or more of these modules. Local memory 106 is a small, high-speed memory and is used to store results during the operations of the data processing part or DSP 108. High-speed access of local memory 106 is possible because this memory is accessed through local bus 116 enabling high-speed transfer of data. An example of local memory 106 is a 32-bit 512 K word SRA.

DSP 108 is connected to main bus 114 and local bus 116. Data is read from one of these buses, DSP processing is performed, and the results are output to the other bus.

Memory I/F part 110 forms an interface by which data are efficiently stored in or retrieved from main memory 112 without placing a burden on data processing part 104. That is, it is basically in charge of mapping for physical addressing in order to store data in main memory 112. For instance, the memory I/F generates the memory address and arranges the signal line and performs logical operations, etc., in accordance with bit width and depth of the memory elements that comprise main memory 112. Memory I/F art 110 should also have an address counter that generates a next memory address.

Main memory 112 is an inexpensive, large-capacity memory. It is used to store the data that are fed to data processing part 104 and DSP 108 and to store the processing results. For example, main memory 112 has a storage capacity of 256 Mbytes and comprises several 64 Mbit DRAMs.

Controller part 120 manages operation of the entire DDP. Controller part 120 comprises sequencer 122 and sequence memory 124. Controller part 120 is connected to external control bus 126 and also to I/0 part 102, data processing part 104, DSP 108 and memory I/F part 110 (the connection is shown in FIG. 3 by symbol A). Controller part 120 controls I/O part 102, data processing part 104, DSP 108, and memory I/F part 110 by controlling sequencer 122, which operates in accordance with a sequence program stored in sequence memory 124.

The reconfigurable logic device of the present invention is a logic device whose internal configuration and input/output block structure are able to be determined, and the gate connections are able to be changed, based on customized data from the outside and therefore, can be programmed as hardware. An example is a field programmable gate array. In ordinary gate arrays, the hardware is altered by determining the specific processing details and then changing the connections between the basic cells comprising the logical gates. By contrast, a wiring process is not needed with the reconfigurable logic device of the present invention and specific hardware can be configured by simply inputting customized data for internal logical configuration.

There are several embodiments of this type of reconfigurable logic device, depending on how the customized data are used.

The first embodiment is the type wherein the customized data is written only once. The second embodiment is the type that has an internal SRAM that stores the customized data. Specific hardware is configured by writing the customized data from another storage medium during the hardware power up sequence. The third embodiment of the reconfigurable logic device is the type that has an internal nonvolatile memory that stores the customized data. The customized data are written only when one wants to change the internal configuration, but this is inferior to the second type of reconfigurable logic device in terms of the number of times the data can be written and the customized data capacity.

Preferably, a second embodiment logic device is used for I/O part 102, data processing part 104, and memory I/F part 110, but it is also possible to use a third embodiment logic device when data loading frequency and capacity are sufficient.

As shown in FIG. 3, I/O part 102, data processing part 104, and memory I/F part 110 are each equipped with write lines, i.e., 132, 134 and 136, respectively, for writing the customized data. It is preferred that write lines 132, 136 and 136 be connected to tester controller 20 and that customized data be stored in tester controller 20 so that the customized data can be written from tester controller 20 when necessary, such as during a hardware power-up sequence.

Tester controller address data bus 128 is connected to I/O part 102, data processing part 104, DSP 108, memory I/F part 110, and controller part 120. Bus 128 is used for conveying the respective state and for control between each part and tester controller 20. Moreover, it is possible to use bus 128 for writing of the data stored in sequence memory 124 from tester controller 20.

By using reconfigurable logic devices for each one of I/O part 102, data processing part 104, and memory I/F part 110, it is possible to simplify the input-output specifications of data processing part 104 and thereby simplify the design.

For example, if the system is designed with the reconfigurable logic device as one block, each of the aforementioned parts share the logic device and therefore, a change in just one part of the system can electrically affect the other parts. Moreover, limiting the number of logic device terminals will restrict some of functions which can be internally configured.

Nevertheless, when reconfigurable logic devices are separately set up at I/O part 102, data processing part 104 and memory I/F part 110, each part is electrically and physically separate and therefore, the aforementioned type of problem will rarely occur. Moreover, when test applications are newly configured by the DDP, and if an application is developed by modifying some parts and reusing the remains instead of rewriting the entire application, it is possible Lo check each part, i.e., the I/O part, the data processing part and the memory I/F part, independently. Thus, design and development are simplified.

In further detail, when each part of the system is separately configured in this way, each part can execute pipeline processing by a simple operation whereby data are transferred in accordance with data and strobe signals, processing is performed in accordance with clock signals, and the results are output to a bus. It is usually not necessary to monitor the state of the other blocks and therefore, design of the system is simplified.

Figure 4:
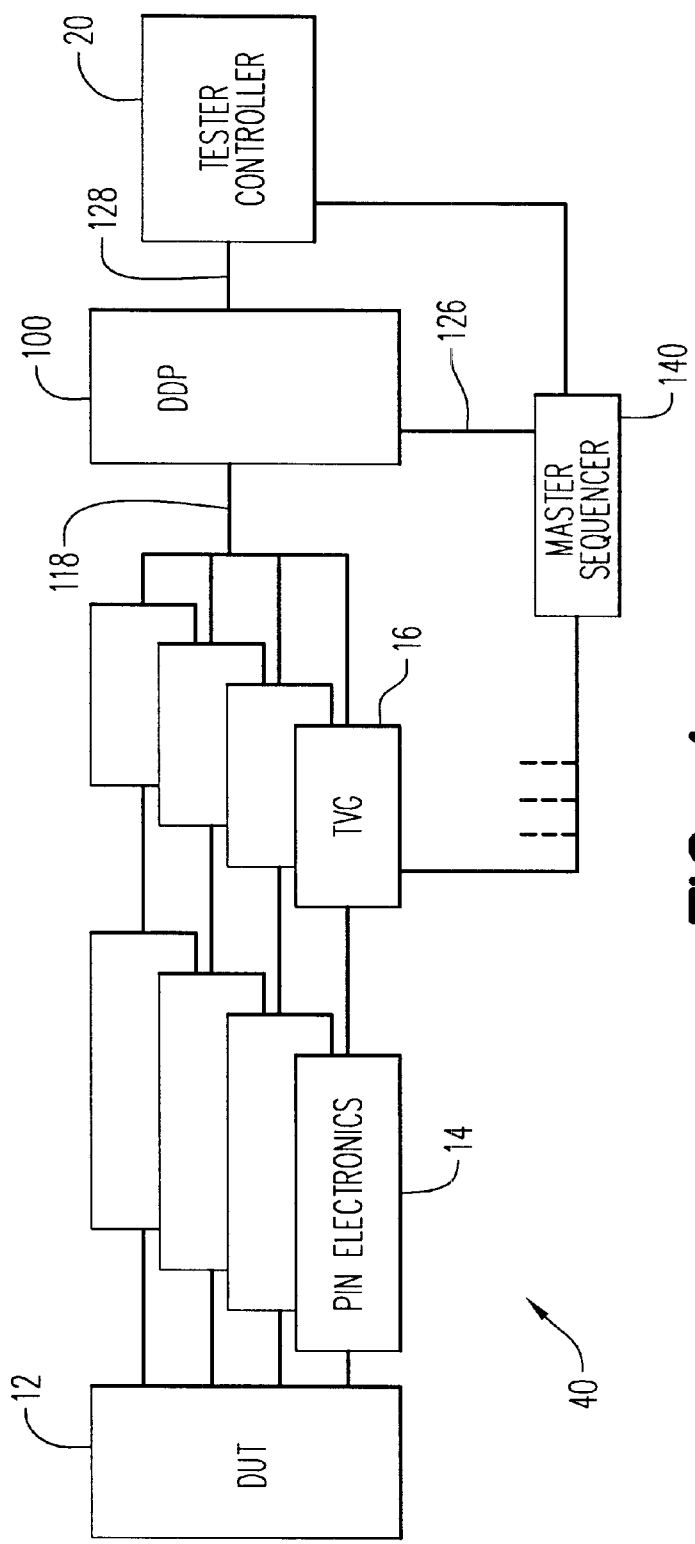
FIG. 4 is a block diagram of an IC tester with the data processing apparatus of the present invention.

FIG. 4 shows a block diagram of IC tester 40 that uses DDP 100. DDP 100 is connected to each TVG 16 via external data bus 118 and to tester controller 20 via tester controller address data bus 128. Master sequencer 140 is connected to each TVG 16, DDP 100 and tester controller 20 and controls when the test is started and stopped, et.

How various IC applications are executed, using DDP 100 with the aforementioned structure, is described below.

Application 1: Data Sequence Generator

For instance, when high-speed generation of random data is necessary, a random number generator of the desired number of bits is configured in the data processing part and random data are formed. The random number generator operates as hardware and therefore, real-time generation is possible at a faster speed than when the tester controller or a DSP including the microprogram generates data.

When a long data run is necessary, it is possible to configure the data in a short amount of time and store the data in large-capacity main memory 112 by means of DSP 108 and then output the data through data processing part 104. It may also configure to output Real-time processing of data that have been formed by DSP 108 which are performed in data processing part 104, simultaneously.

Application 2: Data Evaluating Device

When data with a long header from a communications IC are to be evaluated, a module that detects the header with a counter, et., is configured in data processing part 104 and data remaining after the header has been removed are then stored in the main memory, making real-time retrieval and evaluation of the data possible. A reconfigurable logic device is used for configuration of the module for eliminating the header and therefore, debugging and modification can be performed in a short amount of time at a low cost. Even changes in the length of the header and contents due to changes in the specifications of the IC can be easily accommodated.

Application 3: Imaging IC Evaluating Device

Testing can be performed in a short amount of time when DDP 100 of the present invention is used to determine fluctuations in pixel data that are output as digitally converted signals from an image sensor, such as a CAD or CMOS imager.

An image sensor with a total of 512 k pixels will be given as an example. When determined data of the jth time of pixel i is $x_{ij}$ and, for example, each $x_i$ is measured 10 times each, variance $\sigma_i$ of data for each pixel is found by $$\sigma_i = \sqrt{\frac{\sum_{j=1}^{10} x_{ij}^2 - \frac{\left(\sum_{j=1}^{10} x_{ij}\right)^2}{N}}{N}} \quad (1)$$

In order to perform all calculations with the tester controller, the data for 10 measurements must be stored in memory. This makes a depth of 5 Mwords necessary, which is huge, even when it is transferred to the tester controller. Even if a DSP is used, processing is not as fast as with real-time processing because the DSP is processing with an internal microprogram. Therefore, the calculations cannot be followed up and all of the measurement data must be stored once in the memory.

If the DDP of the present invention is used, high-speed testing is possible, as described below:

First, an operating part that performs squaring and addition operations is configured as hardware in data processing part 104. Real-rime calculation of $$\sum_{j=1}^{10} x_{ij}^2 \text{ and} \quad (2)$$

$$\sum_{j=1}^{10} x_{ij} \quad (3)$$

for each pixel is performed for each measurement and the result is stored in local memory 106. Once data have been received from the image sensor, the $\sigma_i$ of each pixel is found from the data stored in local memory 106, using DSP 108, by performing division, difference operations and square root operations in accordance with formula 1. It is possible to transfer only the value of $\sigma_i$ of each pixel Lo tester controller 20 and therefore, data transfer can be completed in a short amount of time.

The present invention has been illustrated and explained while referring to a preferred embodiment, but the form and details can be modified by those skilled in the art as long as these changes are no outside the core and scope of the present invention.

When the present invention is used, it is possible to configure a digital data processing device that generates or evaluates data that correspond to the many functions of an IC. As a result, the hardware can be dynamically and flexibly modified by the data processing part, I/O part, and memory I/F part and therefore, applications can be developed in a short amount of time. Furthermore, by using the DSP with a reconfigurable logic device, faster testing can be realized because each part of the system is assigned so that it will perform the operation to which it is best suited.

In addition, by using a reconfigurable logic device with the I/O part, data processing part, and memory I/F par, the input-output specifications of the data processing part can be simplified and designing becomes easier. Moreover, one of the devices of the present invention can be used for a variety of IC applications with which data are generated or evaluated and as a result, the cost of developing applications can be reduced. Moreover, one device can adapt precisely and flexibly to specialty IC applications so that it is not necessary to produce many devices.

What is claimed is:

1. A data processing apparatus for an integrated circuit (IC) tester, comprising:
   a first memory;
   a first reconfigurable logic device operative during input and output of data therefrom and thereto, for outputting signals used for generating test vectors for an IC, and for receiving and converting data derived from the IC for internal use in said data processing apparatus, an internal configuration of the first reconfigurable logic device being alterable to accomplish such converting;
   a second reconfigurable logic device for receiving data from, and transmitting data to, the first memory or the first reconfigurable logic device and for processing the data in accordance with an internally configured combination of elements therein, an internal configuration of the second reconfigurable logic device being alterable to accomplish details of said processing of said data;
   a third reconfigurable logic device for establishing a specific interface when data is transmitted and received between the second reconfigurable logic device and the first memory, an internal configuration of the third reconfigurable logic device being alterable in accordance with a selected type of interface with the first memory; and
   writing means coupled to each of said first, second and third reconfigurable logic devices for inputting an internal configuration to each thereof.

2. The data processing apparatus in claim 1, further comprising:
   a second memory for transmitting data to and receiving data from the second reconfigurable logic device; and
   a high speed bus for providing a path for transmission and reception of data between the second memory and the second reconfigurable logic device, said path different from a path for data between the second and third reconfigurable logic devices.

3. The data processing apparatus in claim 2, further comprising:
   a digital signal processor for transmitting data to and receiving data from the second memory and for sending data to and receiving data from the second and third reconfigurable logic devices.

4. The data processing apparatus as recited in claim 3, further comprising:
   a control part for controlling the first through third configurable logic devices and the digital signal processor.

5. The data processing apparatus as recited in claim 4, wherein the control part comprises a sequencer and a sequence memory.

6. The data processing apparatus as recited in claim 1, wherein said first, second and third reconfigurable logic devices comprise field programmable gate arrays (FPGAs).

\* \* \* \* \*